July 23, 1968 D. P. FOUDRIAT 3,394,218

DESTRUCTIBLE PRINTED CIRCUIT ASSEMBLIES CONTAINING OXIDANTS

Filed April 25, 1966

INVENTOR

DONALD P. FOUDRIAT

BY Philip D. Amins

ATTORNEY

1

3,394,218

DESTRUCTIBLE PRINTED CIRCUIT ASSEMBLIES CONTAINING OXIDANTS

Donald P. Foudriat, Nashua, N.H., assignor to Sanders Associates, Inc., Nashua, N.H., a corporation of Delaware Filed Apr. 25, 1966, Ser. No. 544,770

43 Claims. (Cl. 174—68.5)

ABSTRACT OF THE DISCLOSURE

The present invention pertains to a destructible printed circuit board fabricated of combustible materials and having an oxidant as an integral part thereof, whereby upon ignition of the circuit board the oxidant provides sufficient oxygen for the complete destruction of the printed circuit board.

The present invention pertains to destructible printed circuit boards and the method of making the same utilizing combustible materials as an integral part thereof.

Destructible printed circuits are predominantly required in military applications, where in an emergency situation the information contained in the printed circuits must be completely destroyed in order to prevent the same from falling into enemy hands. The circuits are almost always positioned in places which have a minimal amount of air therein and which are extremely difficult to reach, especially when the time available to reach the same is extremely limited.

Previous attempts at producing destructible printed circuit boards and, similarly, means for destroying printed circuit boards, have resulted in the development of pyrotechnic packages positioned in close proximity to an electronic assembly built on a printed circuit board. This method has not been completely satisfactory for the following reasons: firstly, the use of an externally positioned pyrotechnic package requires additional space in a place where space requirements are at a maximum; secondly, the pyrotechnic material only causes the printed circuit board to become charred and the copper to become delaminated from the board, but does not result in the complete destruction of the printed circuit board and of the copper itself. The charring of the printed circuit board does make it somewhat difficult to reconstruct the printed circuit board; however, the same can be reconstructed by a skilled technician.

The most significant deficiency in the pyrotechnic package approach to the destruction of printed circuit boards is that there is insufficient oxygen available for oxidation of the combustible printed circuit board and for the delamination of the copper leads. This is so, although the pyrotechnic package furnishes sufficient oxidant to provide for its own combustion within the immediate area where it, and thus the printed circuit board, is disposed.

From the above discussion, it will be apparent that it is often necessary to completely destroy printed circuit boards which are housed in and form part of a much larger system, without the destruction of the entire system itself.

It is therefore the principal object of the present invention to provide a printed circuit board and method of making the same, which printed circuit board is formed of combustible materials and has an oxidant forming an integral part thereof to permit complete combustion and thus destruction of the printed circuit board, so as to make reconstruction thereof impossible.

It is a more particular object to provide a printed circuit board and method of making the same, wherein the printed circuit board is formed of combustible materials and has

2 an insulating layer or laminate which includes an oxidant as an integral part thereof, to permit complete combustion of said printed circuit board after its ignition.

It is yet another object of the present invention to provide a printed circuit board and method of making the same, wherein the printed circuit board is formed of combustible materials and has an insulating layer or laminate which includes an oxidant as an integral part thereof, and also has a conductive (printed) layer which is formed of a highly flammable material, so as to permit complete combustion of the printed circuit board after its ignition.

It is a further object of the present invention to provide a printed circuit board and method of making the same, wherein the printed circuit board is formed of combustible materials and has a cover layer which includes an oxidant as an integral part thereof, to permit complete combustion of said printed circuit board after its ignition.

It is still another object of the present invention to provide a printed circuit board and method of making the same, wherein the printed circuit board is formed of combustible materials and has an insulating layer which contains an oxidant as an integral part thereof and has a conductive (printed) layer formed of a highly flammable material to thereby permit complete combustion of the printed circuit board after its ignition.

It is yet a further object of the present invention to provide a printed circuit board and method of making the same, wherein the printed circuit board is formed of combustible materials and has an insulating layer which contains an oxidant as an integral part thereof, a conductive (printed) layer formed of a highly flammable material, and a cover layer which includes an oxidant as an integral part thereof, so as to permit complete combustion of the printed circuit board after its ignition.

The invention thus contemplates providing a printed circuit board having an oxidant formed integrally with at least one of the component layers of the printed circuit board, so that once the circuit board has been ignited, it will itself provide sufficient oxygen for the complete combustion thereof.

These, and other objects, features and advantages of the present invention, will become more apparent when considered in light of the following description, in conjunction with the accompanying drawings, wherein.

Figure 1:
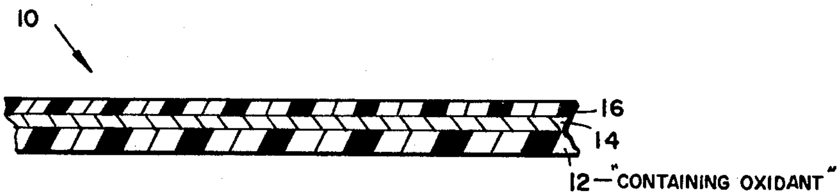
FIG. 1 is a partial sectional view of a printed circuit board incorporating the features of a first embodiment of the present invention.

Referring now to the drawings, and more particularly to FIG. 1 thereof, there is shown a printed circuit board, generally indicated by the reference numeral 10, incorporating the features of the first embodiment of the invention, as will be explained in more detail hereinafter. The printed circuit board 10 comprises an insulating layer 12 and a printed or conductive layer 14, which forms the circuit conductors. The board may also include a conformal coating or cover layer 16 disposed upon conductive layer 14, as depicted in FIG. 1. It should be noted, however, that the use of a cover coating is not essential to the formation of a printed circuit board in view of the present state of the art. The insulating layer 12 is preferably of a laminated construction containing a resin and an oxidant. An example of the construction would be nitrocellulose paper in a paper-resin laminate. The conductive layer 14, preferably made of copper, is printed or laminated to the insulating layer 12 to form the printed circuit board 10. If desired, as discussed above, the printed circuit board can be constructed by superimposing cover layer 16 upon said conductive layer. The cover layer may be formed from nitrocellulose, modified epoxies, polyurethanes and similar types of materials.

The insulating layer is normally fabricated by heat-pressing several individual laminae together at temperatures of about 400° F.; electrical components (not shown) are normally soldered to the printed circuit or conductive layer at a maximum temperature of about 600° F. Thus, the insulating layer should be fabricated such that it becomes flammable at a temperature in the range of approximately 700–1000° F. The oxidant in the resin laminate should be present in stoichiometric proportions in order to provide for complete combustion of the resin as well as the oxidation and delamination of the copper circuit conductors and for combustion of the cover layer, if one is utilized, after the printed circuit board has been ignited.

One method of igniting the printed circuit board would be to connect a small pyrotechnic package, about the size of a capacitor, to the circuit board. The pyrotechnic package would then be ignited in a manner well-known in the art, and the ignition of the pyrotechnic package in turn will cause ignition of the printed circuit board, after which there will be complete combustion thereof.

It will be appreciated that there are many oxidants which may be utilized for the purpose of supplying a sufficient amount of oxygen to provide for complete combustion of the printed circuit board, the amount of oxidant present preferably being slightly in excess of that required for complete combustion of said circuit board. The following list of oxidants is herein set forth by way of illustration and not for the purpose of limitation, it being apparent to those skilled in the art that many other oxidants would serve equally as well:

Nitrocellulose
Pyroxlin (cellulose nitrate)
Trinitrotoluene
Ammonium nitrate
Sodium nitrate
Potassium nitrate
Picric acid
Potassium chlorate
Sodium chlorate
Barium chromate
Potassium perchlorate
Lithium nitrate
Ammonium picrate
Guanidine picrate
Celluloid (cellulose nitrate)
Pentaerythritol tetranitrate
Trimethylene-trinitramine
Dinitrotoluene
Ammonium perchlorate
Diethyleneglycol nitrate
Lithium perchlorate
Sodium perchlorate It is herein to be noted that, although the first embodiment of the present invention has been described as having the oxidant formed as an integral part of the insulating layer, the oxidant may also be included as an integral part of the cover layer, either in place of the oxidant-containing insulating layer or in conjunction therewith.

A particular example of an insulating layer containing an oxidant is described hereinafter by way of illustration.

*Example*

Nitrocellulose was combined with sodium nitrate, an oxidant, to form the desired insulating layer.

The molecular weight (MW) of nitrocellulose $$[C_6H_7O_5(NO_2)_3]$$

is 297. The number of moles of oxygen required to oxidize the carbon and hydrogen in the nitrocellulose is 15.5, determined as follows:

$$6C + 6O_2 \longrightarrow 6CO_2$$

$$7H + \frac{7}{4}O_2 \longrightarrow \frac{7}{2}H_2O$$

Therefore, 7.75 moles of $O_2 \equiv 1$ mole of nitrocellulose, or 15.5 moles of $O \equiv 1$ mole nitrocellulose.

Since 1 mole of nitrocellulose contains 11 moles of oxygen, an additional 4.5 moles plus an excess is needed from the oxidant, which is sodium nitrate [$NaNO_3$], which has an M.W. of 85. In this case, 10 moles of oxygen were derived from the sodium nitrate, thus requiring 4 moles thereof. This provides 12 moles of oxygen. However, it will be appreciated that, during the combustion of sodium nitrate, some of the oxygen combines with the sodium, for which it has a great affinity.

Thus, the insulating layer was fabricated utilizing one mole of nitrocellulose and 4 moles of sodium nitrate, and an insulating layer was formed consisting of 297 grams of nitrocellulose and 340 grams of sodium nitrate, computed on a dry weight basis.

Figure 2:
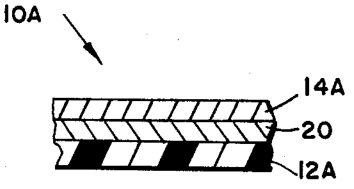
FIG. 2 is a partial sectional view of a printed circuit board incorporating the features of a second embodiment of the present invention.

A second embodiment of the present invention is depicted in FIG. 2, wherein similar parts are denoted by similar reference numerals. The partial sectional view of a printed circuit board 10A shown in FIG. 2 depicts an insulating layer 12A of a laminated construction. An oxidant layer 20, such as iron oxide, is laminated upon said insulating layer 12A; and a printed or conductive layer 14A is laminated upon the oxidant layer 20. The conductive layer 14A, which forms the circuit conductors, is preferably made of metals having relative low melting points and/or high degrees of combustibility, i.e., they are highly flammable. By way of illustration, some metals which satisfy these conditions are aluminum, magnesium, lead and zinc. If aluminum were utilized to form the conductive layer 14A, and iron oxide were utilized as the oxidant, it will be readily seen that this is the thermit incendiary construction. It will be appreciated, of course, that the above is merely an example of materials which can be utilized in this embodiment; and it will be apparent to those skilled in the art that many other oxidants and metals may be utilized equally well. Although not shown, the conductive layer 14A may have a cover coating applied thereupon, as discussed previously in conjunction with the first embodiment of the invention, depicted in FIG. 1.

It is herein to be noted that, although the oxidant layer 20 has been described as a separate layer, it is preferably formulated as part of the laminated insulating layer 12A. More particularly, the oxidant layer 20 preferably consists of several laminae laminated to said insulating layer, thus serving as the surface laminations of said insulating layer.

Figure 3:
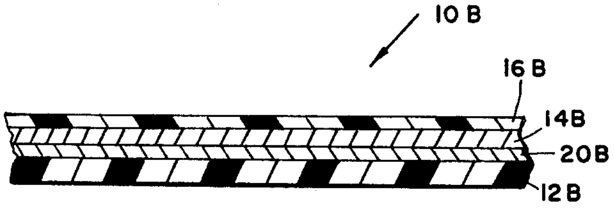
FIG. 3 is a partial sectional view of a printed circuit board incorporating the features of a third embodiment of the present invention.

A third embodiment of the invention is depicted in FIG. 3, wherein similar parts are denoted by similar reference numerals. It is herein to be noted that the embodiment depicted in FIG. 3 is actually a combination of the features set forth in FIGS. 1 and 2.

FIG. 3 depicts a partial sectional view of a printed circuit board 10B having an insulating layer 12B, an oxidant layer 20B, a conductive or printed layer 14B and, if desired, a cover layer 16B. The insulating layer 12B is of a laminated construction containing a resin and an oxidant, as above described in conjunction with FIG. 1. An oxidant layer 20B is laminated upon the said insulating layer as the surface laminations of one surface thereof, and the printed or conductive layer 14B is laminated upon the oxidant layer 20B. The oxidant layer 20B and conductive layer 14B are the same as those discussed heretofore in conjunction with FIG. 2. It is thus seen that the printed circuit board 10B is capable of complete combustion after the ignition of the circuit board. The insulating layer 12B and the oxidant layer 20B, together, supply sufficient oxygen for the complete combustion of said printed circuit board. If desired, the board may have a cover coating 16B applied over the conductive layer 14B. The cover layer may serve only to protect the printed layer, or alternatively, it may contain an oxidant to assist in the combustion of the printed circuit board.

It is herein to be noted that, although the cover or coating layer in all of the embodiments has been described as a conformal coating, it may also be formed of a solder resist, that is, a coating applied upon the circuit conductors to prevent portions of said conductors from being soldered when the aforementioned electrical elements (not shown) are soldered to the printed circuit board, and may also have an oxidant incorporated therein as an integral part thereof.

Figure 4:
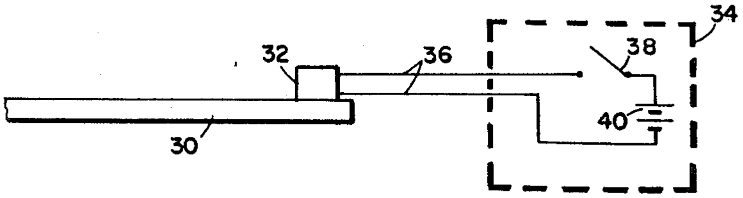
FIG. 4 depicts a system for igniting the destructible printed circuit board of the present invention.

A system for igniting the destructible printed circuit boards described hereinabove is depicted in FIG. 4, wherein there is shown a destructible printed circuit board 30, constructed in accordance with the present invention, a pyrotechnic package 32, and an igniting device 34. The pyrotechnic package is mounted upon the printed circuit board and is connected to the igniting device 34 by means of leads 36. The igniting device comprises a switch 38 and a suitable voltage source, such as battery 40, and is remotely spaced from the printed circuit board having the pyrotechnic package mounted thereon.

When it is desired to initiate combustion of the printed circuit board 30, switch 38 is closed, thus causing current to flow from the battery 40 to the pyrotechnic package 32. The current flowing into the pyrotechnic package causes the same to ignite, which in turn causes ignition of the printed circuit board. After the printed circuit board has been ignited, the oxidant contained therein permits complete combustion of said circuit board and thus destruction of the same.

Although the pyrotechnic package has herein been shown and described as being directly connected to the ignition device, it may also be remotely controlled by the ignition device. Thus, the pyrotechnic package would be equipped to receive a signal transmitted by said ignition device and, upon receiving said signal, would ignite. In this case, the pyrotechnic package itself would have its source of ignition contained therein.

It is thus seen that there has been provided a destructible printed circuit board and method of making the same, whereby, after ignition, there will be complete combustion of the circuit board, completely destroying the same and the circuit information contained therein.

Although the present invention has been described in conjunction with a printed circuit board having only one conductive layer therein, it is also possible to construct printed circuit boards in accordance with the present invention having conductive layers on both surfaces of the insulating layer, whereby two separate electrical circuits can be printed on one circuit board.

It will thus be apparent to those skilled in the art that there can be many changes in the materials utilized to form the printed circuit boards of the present invention, and also many modifications can be made in the various embodiments of the present invention without departing from the spirit and scope thereof, as defined in the appended claims.

What is claimed is:

1. A printed circuit board assembly comprising
a substrate having a conductive pattern thereon, and an oxidant as an integral part thereof,
said oxidant being capable of supplying sufficient oxygen for the substantially complete combustion of said printed circuit board assembly after ignition thereof.

2. A printed circuit board assembly in accordance with claim 1, wherein
said substrate comprises an insulating layer,
said conductive pattern comprises a conductive layer, and
said insulating layer has said oxidant formed as an integral part thereof.

3. A printed circuit board assembly in accordance with claim 2, including
a cover layer,
said cover layer covering said conductive layer.

4. A printed circuit board assembly in accordance with claim 1 including a cover layer, wherein
said substrate comprises an insulating layer,
said conductive pattern comprises a conductive layer,
said conductive layer is disposed upon said insulating layer,
said cover layer covers said conductive layer, and
said insulating layer and said cover layer each have said oxidant formed as an integral part thereof.

5. A printed circuit board assembly in accordance with claim 4, wherein the cover layer is conformal with said insulating layer.

6. A printed circuit board assembly in accordance with claim 1, wherein
said substrate comprises a laminated insulating layer,
said conductive pattern comprises a conductive layer,
said oxidant comprises an oxidant layer disposed upon said laminated insulating layer,
said conductive layer is disposed upon said oxidant layer, and
said conductive layer is formed of a highly flammable metal, which metal forms the conductive pattern of said printed circuit.

7. A printed circuit board assembly in accordance with claim 6, including
a cover layer,
said cover layer covering said conductive layer.

8. A printed circuit board assembly in accordance with claim 7, wherein
said cover layer includes an oxidant as an integral part thereof.

9. A printed circuit board assembly in accordance with claim 1, wherein
said substrated comprises a laminated insulating layer,
said conductive pattern comprises a conductive layer,
said oxidant comprises an oxidant layer,
said laminated insulating layer has an oxidant formed as an integral part thereof,
said oxidant layer is disposed upon said laminated insulating layer,
said conductive layer is disposed upon said oxidant layer, and
said conductive layer is formed of a highly flammable metal, which metal forms the conductive pattern of said printed circuit.

10. A printed circuit board assembly in accordance with claim 9, including
a cover layer,
said cover layer covering said conductive layer.

11. A printed circuit board assembly in accordance with claim 10, wherein
said cover layer includes an oxidant as an integral part thereof.

12. A printed circuit board assembly in accordance with claim 1, wherein said oxidant is selected from the group consisting of nitrocellulose, cellulose nitrate, trinitrotoluene, ammonium nitrate, sodium nitrate, potassium nitrate, picric acid, potassium chlorate, sodium chlorate, barium chromate, potassium perchlorate, lithium nitrate, ammonium picrate, guanidine picrate, pentaerythritol tetranitrate, trimethylene-trinitramine, dinitrotoluene, ammonium perchlorate, diethyleneglycol nitrate, lithium perchlorate, and sodium perchlorate.

13. A printed circuit board assembly in accordance with claim 1, wherein said oxidant is nitrocellulose.

14. A printed circuit board assembly in accordance with claim 1, wherein said oxidant is cellulose nitrate.

15. A printed circuit board assembly in accordance with claim 1, wherein said oxidant is trinitrotoluene.

16. A printed circuit board assembly in accordance with claim 1, wherein said oxidant is ammonium nitrate.

17. A printed circuit board assembly in accordance with claim 1, wherein said oxidant is sodium nitrate.

18. A printed circuit board assembly in accordance with claim 1, wherein said oxidant is potassium nitrate.

19. A printed circuit board assembly in accordance with claim 1, wherein said oxidant is picric acid.

20. A printed circuit board assembly in accordance with claim 1, wherein said oxidant is potassium chlorate.

21. A printed circuit board assembly in accordance with claim 1, wherein said oxidant is sodium chlorate.

22. A printed circuit board assembly in accordance with claim 1, wherein said oxidant is barium chromate.

23. A printed circuit board assembly in accordance with claim 1, wherein said oxidant is potassium perchlorate.

24. A printed circuit board assembly in accordance with claim 1, wherein said oxidant is lithium nitrate.

25. A printed circuit board assembly in accordance with claim 1, wherein said oxidant is ammonium picrate.

26. A printed circuit board assembly in accordance with claim 1, wherein said oxidant is guanidine picrate.

27. A printed circuit board assembly in accordance with claim 1, wherein said oxidant is pentaerythritol tetranitrate.

28. A printed circuit board assembly in accordance with claim 1, wherein said oxidant is trimethylene-trinitramine.

29. A printed circuit board assembly in accordance with claim 1, wherein said oxidant is dinitrotoluene.

30. A printed circuit board assembly in accordance with claim 1, wherein said oxidant is ammonium perchlorate.

31. A printed circuit board assembly in accordance with claim 1, wherein said oxidant is diethyleneglycol nitrate.

32. A printed circuit board assembly in accordance with claim 1, wherein said oxidant is lithium perchlorate.

33. A printed circuit board assembly in accordance with claim 1, wherein said oxidant is sodium perchlorate.

34. A printed circuit board assembly in accordance with claim 1, wherein
- said substrate comprises a laminated insulating layer,
- said conductive pattern comprises a conductive layer,
- said laminated insulating layer comprises a plurality of laminae containing insulating material and a plurality of laminae containing an oxidant, and
- said conductive layer is formed of a highly flammable metal, which metal forms the conductive pattern of said printed circuit.

35. A printed circuit board assembly in accordance with claim 34, including
- a cover layer,
- said cover layer covering said conductive layer.

36. A printed circuit board assembly in accordance with claim 35, wherein said cover layer is formed of a solder resist.

37. A printed circuit board assembly in accordance with claim 1 including a cover layer, wherein
- said substrate comprises a laminated insulating layer,
- said conductive pattern comprises a conductive layer,

- said conductive layer is disposed upon said laminated insulating layer,
- said cover layer covers said conductive layer,
- said laminated insulating layer has a plurality of laminae containing insulating material and a plurality of laminae containing oxidant,
- said conductive layer is formed of a highly flammable metal, which metal forms the conductive pattern of said printed circuit, and
- said cover layer has an oxidant as an integral part thereof.

38. A printed circuit board assembly in accordance with claim 37, wherein the cover layer is conformal wi.h said laminated insulating layer.

39. A printed circuit board assembly in accordance with claim 1, wherein
- said substrate comprises a laminated insulating layer,
- said oxidant comprises at least one laminated oxidant layer,
- said conductive pattern comprises a conductive layer,
- said laminated oxidant layer is disposed upon at least one surface of said laminated insulating layer,
- said conductive layer is disposed upon said oxidant layer,
- said laminated insulating layer comprises a plurality of laminae containing insulating material,
- said laminated oxidant layer comprises a plurality of laminae containing oxidant, and
- said conductive layer is formed of a highly flammable metal, which metal forms the conductive pattern of said printed circuit.

40. A printed circuit board assembly in accordance with claim 39, including
- a cover layer,
- said cover layer covering said conductive layer.

41. A printed circuit board assembly in accordance with claim 40, wherein said cover coating is formed of a solder resist.

42. A printed circuit board assembly in accordance with claim 1 including a cover layer, wherein
- said substrate comprises a laminated insulating layer,
- said oxidant comprises a laminated oxidant layer,
- said conductive pattern comprises a conducitve layer,
- said laminated oxidant layer is disposed upon said laminated insulating layer,
- said conductive layer is disposed upon said laminated oxidant layer,
- said cover layer covers said conductive layer,
- said laminated insulating layer comprises a plurality of laminae containing insulating material and a plurality of laminae containing oxidant,
- said laminated oxidant layer has a plurality of laminae containing oxidant,
- said conductive layer is formed of a highly flammable metal, which metal forms the conductive pattern of said printed circuit, and
- said cover layer has an oxidant as an integral part thereof.

43. A printed circuit board assembly in accordance with claim 42, wherein said cover layer is conformal with said insulating layer.

References Cited

FOREIGN PATENTS 1,149,603 5/1963 Germany.

DARRELL L. CLAY, *Primary Examiner.*